(12) United States Patent
Hirai et al.

(10) Patent No.: US 7,619,199 B2
(45) Date of Patent: Nov. 17, 2009

(54) TIME-RESOLVED MEASUREMENT APPARATUS AND POSITION-SENSITIVE ELECTION MULTIPLIER TUBE

(75) Inventors: Nobuyuki Hirai, Hamamatsu (JP); Mitsunori Nishizawa, Hamamatsu (JP)

(73) Assignee: Hamamatsu Photonics K.K., Hamamatsu-shi, Shizuoka (JP)

(*) Notice: Subject to any disclaimer, the term of this patent is extended or adjusted under 35 U.S.C. 154(b) by 287 days.

(21) Appl. No.: 10/561,917

(22) PCT Filed: Jun. 24, 2004

(86) PCT No.: PCT/JP2004/009282

§ 371 (c)(1),
(2), (4) Date: Mar. 23, 2007

(87) PCT Pub. No.: WO2004/113890

PCT Pub. Date: Dec. 29, 2004

(65) Prior Publication Data

US 2007/0263223 A1    Nov. 15, 2007

(30) Foreign Application Priority Data

Jun. 25, 2003    (JP) ............................. 2003-181546

(51) Int. Cl.
*H01J 43/04* (2006.01)
*H01J 31/50* (2006.01)

(52) U.S. Cl. .................. 250/214 VT; 250/207; 313/528; 313/534; 313/103 CM; 313/105 CM

(58) Field of Classification Search ............... 313/528, 313/532, 534, 103 CM, 150 CM; 250/207, 250/214 VT See application file for complete search history.

(56) References Cited

U.S. PATENT DOCUMENTS 5,940,545 A * 8/1999 Kash et al. .................. 382/312

(Continued)

FOREIGN PATENT DOCUMENTS

JP    61-266942    11/1986

(Continued)

OTHER PUBLICATIONS

S. Charbonneau et al., "Two-Dimensional Time-Resolved Imaging With 100-ps Resolution Using a Resistive Anode Photomultilpier Tube", Rev. Sci. Instrum. 63 (11), Nov. 1992, pp. 5315-5319.

*Primary Examiner*—Constantine Hannaher
*Assistant Examiner*—Casey Bryant
(74) *Attorney, Agent, or Firm*—Drinker Biddle & Reath LLP

(57) ABSTRACT

A time-resolved measurement apparatus (100) reads a detection timing pulse from an MCP (24) in a front-side MCP stack (30) in a photomultiplier tube (14). A detection timing of a photon is determined based on this pulse. A principal component of this pulse is a potential rise pulse in response to the emission of photoelectrons from the MCP (24), and it has the positive polarity. On the other hand, when photoelectrons are incident on the front-side stack (30), a pulse of the negative polarity is generated to deform the waveform of the detection timing pulse. However, since the number of the photoelectrons incident on the front-side stack (30) is fewer than that of those incident on a rear-side stack (32), the negative component is small in the detection timing pulse. This results in enhancing the time precision of the time-resolved measurement.

12 Claims, 7 Drawing Sheets

U.S. PATENT DOCUMENTS

| | | | |
|---|---|---|---|
| 7,425,694 B2 * | 9/2008 | Nishizawa et al. | 250/207 |
| 2003/0015661 A1 * | 1/2003 | Lee et al. | 250/315.3 |
| 2006/0081770 A1 * | 4/2006 | Buchin | 250/214 VT |

FOREIGN PATENT DOCUMENTS

| | | | |
|---|---|---|---|
| JP | 07211280 A * | 8/1995 | |
| JP | 08-292090 | 11/1996 | |
| JP | 10-150086 | 6/1998 | |
| JP | 11-132953 | 5/1999 | |
| JP | 2000-304697 | 11/2000 | |

* cited by examiner

TIME-RESOLVED MEASUREMENT APPARATUS AND POSITION-SENSITIVE ELECTION MULTIPLIER TUBE

TECHNICAL FIELD

The present invention relates to a position-sensitive electron multiplier tube (PS-EMT) and a time-resolved measurement apparatus using the position-sensitive electron multiplier tube.

BACKGROUND ART

There are known two-dimensional time-resolved measurement apparatus for performing time-resolved measurement of light emission to acquire a two-dimensional position and time thereof. Such apparatus are disclosed in Japanese Patent Application Laid-Open No. 61-266942, Japanese Patent Application Laid-Open No. 10-150086, and Article "Two-dimensional time-resolved imaging with 100-ps resolution using a resistive anode photomultiplier tube" by S. Charbonneau et al. (Rev. Sci. Instrum. 63 (11), USA, American Institute of Physics, November 1992, pp5315-5319). The apparatus disclosed in the Charbonneau et al. multiplies a photon emitted from a sample, by a plurality of micro channel plates (MCPs). A pulse signal indicating the detection timing of the photon is taken out of the MCP nearest to the anode in the photomultiplier tube.

DISCLOSURE OF THE INVENTION

An object of the present invention is to enhance the time precision in the time-resolved measurement.

A time-resolved measurement apparatus according to the present invention acquires position information and timing information of a quantum beam generated due to excitation of a sample. This apparatus comprises: a signal generator for generating a reference time pulse in synchronization with the excitation of the sample; a detector for detecting light to generate a position signal corresponding to a detection position and a detection timing pulse synchronized with a detection timing; a position calculator for calculating the detection position using the position signal; a time difference measuring device for measuring a time difference between the reference time pulse and the detection timing pulse; and a data processor for storing the detection position calculated by the position calculator and the time difference measured by the time difference measuring device, in association with each other. The detector has a position-sensitive electron multiplier tube. The electron multiplier tube has an entrance window through which the quantum beam is incident, an anode, and first and second micro channel plates interposed between the entrance window and the anode. The first micro channel plate has an input face located opposite and apart from a cathode, and an output face located opposite and apart from the second micro channel plate. The second micro channel plate has an input face located opposite and apart from the output face of the first micro channel plate, and an output face located opposite and apart from the anode. The detection timing pulse is generated in response to a potential change that occurs when electrons multiplied by the micro channel plate are emitted from the output face of the first micro channel plate, and is fed to the time difference measuring device.

The quantum beam embraces charged particles which are, for example, electrons, ions, α-rays, β-rays and the like, photons which are, for example, ultraviolet rays, X-rays, γ-rays and the like, and further embraces neutrons and others. The generation of the quantum beam due to the excitation of the sample is a phenomenon in which an atom, a molecule, or the like transfers from a low energy state to a higher energy state by external stimulation such as heat, light, radiation or the like, and returns from the excited state to the low energy state while emitting the difference between the energies in the two states as a quantum beam such as light (cf. the aforementioned Patent Document 1 and Non-patent Document 1). It is also known that when a semiconductor device is activated spontaneously or in response to an external trigger (signal pulse, operation start pulse, or the like), transient emission occurs in conjunction with a switching operation of a transistor in the device (cf. the aforementioned Patent Document 2). The generation of the quantum beam due to the excitation of the sample in the present invention also embraces the transient emission observed upon the operation of semiconductor devices, in addition to the phenomenon in which an atom or molecule emits the difference between the energies in two states as a quantum beam such as light.

The detection timing pulse taken out of a micro channel plate includes a component of the positive polarity resulting from emission of multiplied electrons from the micro channel plate, and also includes a component of the negative polarity resulting from incidence of the quantum beam into the micro channel plate. If the detection timing pulse were taken out of the second micro channel plate, unlike the present invention, the positive component would have the magnitude corresponding to the amount of electrons multiplied by the first and second micro channel plates, and the negative component would have the magnitude corresponding to the amount of electrons multiplied by the first micro channel plate. The first and second micro channel plates have their respective multiplication fluctuations that are not correlated with each other. For this reason, the ratio between the positive component and the negative component of the detection timing pulse varies for each detection. Therefore, the timing when the detection timing pulse crosses the ground level, i.e., the zero-cross timing also differs in every detection. As a result, there occur fluctuations in the time difference between the reference time pulse and the detection timing pulse, so as to degrade the time precision of the time-resolved measurement.

In contrast, the present invention concerns the configuration wherein the detection timing pulse is taken out of the first micro channel plate located in front of the second micro channel plate. The negative component of this detection timing pulse is generated in response to incidence of the quantum beam into the first micro channel plate. For this reason, the magnitude of the negative component is free of the influence of the electron multiplication by the first and second micro channel plates. Therefore, the negative component is small in the detection timing pulse. This results in suppressing the variation in the zero-cross timing of the detection timing pulse and thus enhancing the time precision of the time-resolved measurement.

The time-resolved measurement apparatus according to the present invention may further comprise: a first stack having the first micro channel plate, and at least one micro channel plate disposed on the input face of the first micro channel plate; and a second stack having the second micro channel plate, and at least one micro channel plate disposed on the input face of the second micro channel plate and located opposite and apart from the first micro channel plate. The positive component of the detection timing pulse is created by electrons multiplied by the plurality of micro channel plates in the first stack. On the other hand, the negative component is created by incidence of the quantum beam into the first stack and is free of the influence of the electron multiplication by the micro channel plates in the first stack. For this reason, the negative component is extremely smaller than the positive component. This results in further suppressing the variation in the zero-cross timing of the detection timing pulse and thus enhancing the time precision of the time-resolved measurement.

The first stack is preferably located opposite the entrance window with no other micro channel plate being interposed between the entrance window and the first stack. In this case, the negative component of the detection timing pulse is free not only of the influence of the electron multiplication by the micro channel plates in the first stack, but also of the influence of the electron multiplication by other micro channel plates. For this reason, the negative component of the detection timing pulse becomes extremely small. This enhances the time precision of the time-resolved measurement.

The first stack may have a photoelectron multiplication factor higher than that of the second stack. This is advantageous in preventing saturation of the electron multiplication. This results in efficiently multiplying photoelectrons, whereby the position signal can be acquired with high S/N. Since the magnitude of the negative component of the detection timing pulse is free of the influence of the electron multiplication by the first stack, the negative component is kept small regardless of the multiplication factor of the first stack. Accordingly, it is feasible to achieve high position detection accuracy and high time precision together.

The position-sensitive electron multiplier tube may further comprise a photocathode for converting the quantum beam into a photoelectron by photoelectric effect, and the photocathode is disposed between the entrance window and the input face of the first micro channel plate. The first micro channel plate is located opposite the photocathode and receives the photoelectron from the photocathode to generate and multiply secondary electrons. In this case, the photoelectron is incident on the first micro channel plate. The negative component of the detection timing pulse has the magnitude corresponding to the amount of the incident photoelectron. On the other hand, the positive component of the detection timing pulse has the magnitude corresponding to the amount of the secondary electrons multiplied by the first micro channel plate. For this reason, the negative component becomes extremely smaller than the positive component. Therefore, this results in suppressing the variation in the zero-cross timing of the detection timing pulse and thus enhancing the time precision of the time-resolved measurement.

A position-sensitive electron multiplier tube according to the present invention comprises: an entrance window that transmits a quantum beam; first and second micro channel plates for generating electrons at a position corresponding to an incidence position of the quantum beam on the entrance window and for multiplying the electrons while maintaining the position; an anode located opposite the second micro channel plate; and a pulse reading circuit connected to the first micro channel plate and adapted to acquire from the first micro channel plate a pulse signal corresponding to a potential change that occurs when electrons multiplied by the first micro channel plate are emitted from the first micro channel plate. The first micro channel plate has an input face located opposite and apart from the entrance window, and an output face located opposite and apart from the second micro channel plate. The second micro channel plate has an input face located opposite and apart from the output face of the first micro channel plate, and an output face located opposite and apart from the anode. The pulse reading circuit is connected to the output face of the first micro channel plate.

The pulse reading circuit is connected to the first micro channel plate rather than to the second micro channel plate. The negative component of the pulse signal acquired by the pulse reading circuit is generated in response to incidence of the quantum beam into the first micro channel plate. For this reason, the magnitude of the negative component is free of the influence of the electron multiplication by the first and second micro channel plates. As a result, the negative component is small in the pulse signal, and this suppresses the variation in the zero-cross timing of the detection timing pulse. Therefore, by using this pulse signal as a signal indicating the detection timing of the quantum beam, it becomes feasible to perform the time-resolved measurement with high time precision.

The aforementioned and other objects and novel features of the present invention will become more fully apparent in view of the following description with reference to the accompanying drawings. It is, however, noted that the drawings are presented for illustrative purposes only and do not limit the technical scope of the present invention.

BEST MODE FOR CARRYING OUT THE INVENTION

Figure 1:
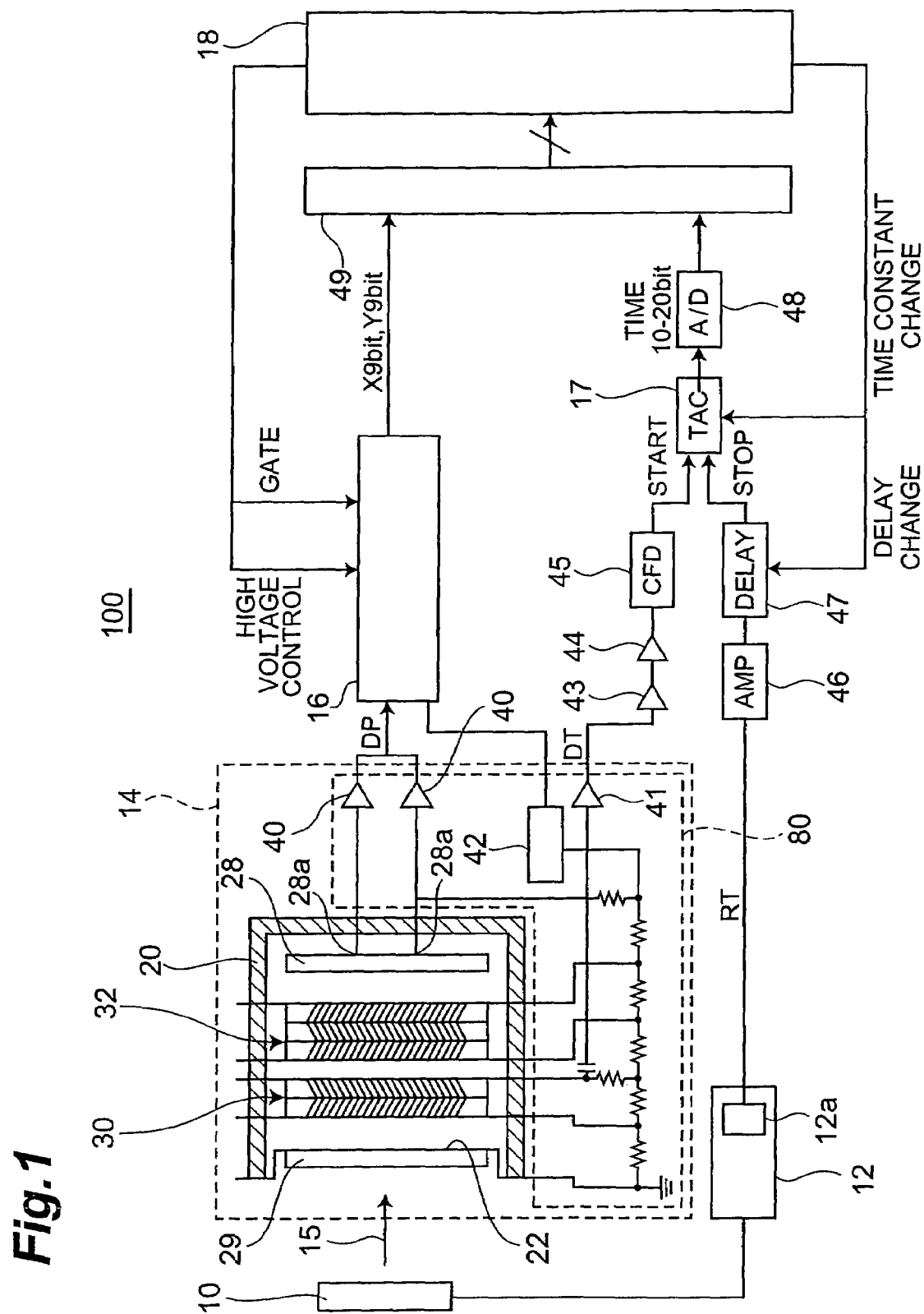
FIG. 1 is a block diagram showing a configuration of a time-resolved measurement apparatus according to the first embodiment.

Preferred embodiments of the present invention will be described below in detail with reference to the accompanying drawings. For easier understanding, identical or equivalent elements common to the drawings will be denoted by similar reference numerals, without redundant description.

FIRST EMBODIMENT

FIG. 1 is a block diagram showing the configuration of time-resolved measurement apparatus 100 according to an embodiment. The apparatus 100 detects a photon 15 emitted from a sample 10 and measures the two-dimensional position and timing of the emission. The apparatus 100 has a semiconductor tester 12, position-sensitive photomultiplier tube (PS-PMT) 14, position calculator 16, time-to-amplitude converter (TAC) 17, and data processor 18.

In the present embodiment, a chip having a semiconductor integrated circuit (IC) thereon is prepared as an example of the sample 10. The semiconductor tester 12 is an excitation device for supplying an activation pulse to the sample 10 so as to cause light emission. The tester 12 applies a drive voltage to the IC on the sample 10 to activate it. Each transistor in the IC emits light with a low probability upon a switching operation thereof. Therefore, by measuring the two-dimensional position and timing of the light emission using the apparatus 100, it becomes feasible to analyze operation timings of transistors. The tester 12 includes a signal generator 12a for generating a reference time pulse RT in synchronization with the activation pulse supplied to the sample 10. This pulse RT is fed to the time-to-amplitude converter 17.

Figure 2:
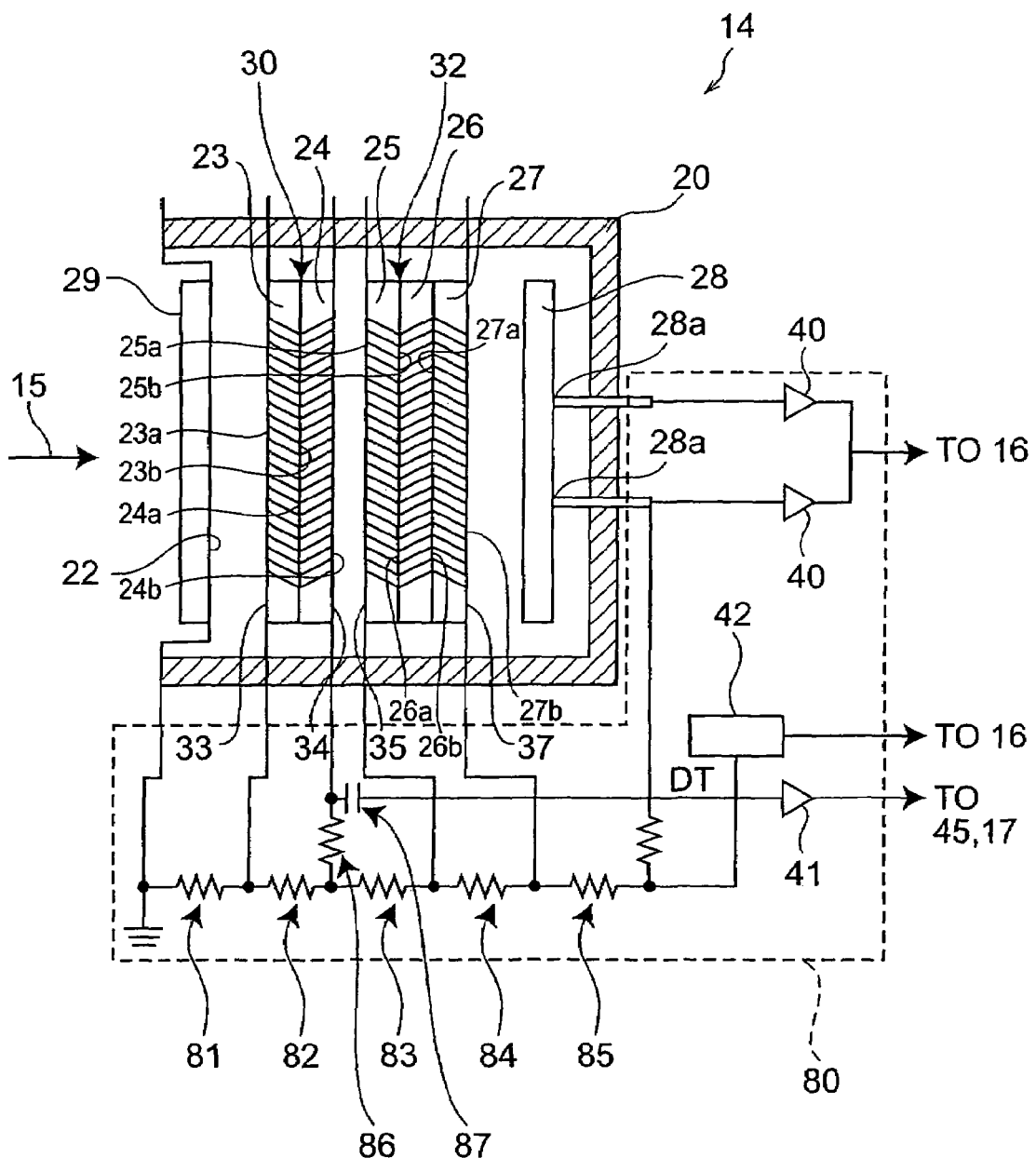
FIG. 2 is a schematic view showing the structure of a photomultiplier tube according to the first embodiment.

FIG. 2 is a schematic view showing the structure of the position-sensitive photomultiplier tube 14. The photomultiplier tube 14 converts the photon 15 emitted from the sample 10, into an electron and multiplies the electron while maintaining the two-dimensional position thereof. The photomultiplier tube 14 has an enclosure 20 and a voltage divider circuit 80 connected to the enclosure 20. In the enclosure 20, a photocathode 22, micro channel plates (MCPs) 23-27, and a resistive anode 28 are contained. A transparent entrance window 29 is provided in the front face of enclosure 20. The photocathode 22 is formed on the inner face of the entrance window 29. The photocathode 22 and the resistive anode 28 are located opposite and apart from each other. The MCPs 23-27 are located between the photocathode 22 and the resistive anode 28.

The photocathode 22 receives the photon 15 that has passed through the entrance window 29 and converts it into a photoelectron by photoelectric effect. The photocathode 22 is sometimes called a "photoelectric surface."

The MCPs 23-27 are electron multipliers of plate shape for receiving the photoelectron from the photocathode 22 to generate and multiply secondary electrons. The planar shape of the MCPs may be circular or rectangular. The front face and back face of each MCP are coated with an evaporated electroconductive material as an electrode. The front faces 23a-27a of the respective MCPs are input faces for receiving the photoelectron or secondary electrons, and the back faces 23b-27b are output faces for emitting secondary electrons. The photoelectron is first incident on the foremost MCP 23. The incidence position of the photoelectron corresponds to the incidence position of the photon 15 on the photocathode 22. The MCP 23 generates secondary electrons at the incidence position of the photoelectron and multiplies the secondary electrons while maintaining the two-dimensional position thereof. The subsequent MCPs 24-27 also multiply the secondary electrons while maintaining the two-dimensional position.

The MCPs 23-27 have a number of channels through which the secondary electrons pass, and the secondary electrons are multiplied during their traveling in the channels. More specifically, each MCP has a structure in which a number of very thin glass pipes are bundled. These glass pipes are the channels. The individual channels act as independent electron multipliers. The inner wall of each channel is an electric resistor, and is an electron emitter also. When a quantum (e.g., a photoelectron in the present embodiment) to which the MCP is sensitive is incident on the inner wall of one channel, at least one electron is emitted from the inner wall.

The electron emitted from the inner wall of the channel in response to the incidence of the quantum onto the input face of the MCP is accelerated by an electric field generated by a voltage applied to the both ends of the MCP, and travels on a parabolic orbit to collide with the opposite portion of the wall. This collision causes emission of secondary electrons from the inner wall. Such electron emission is repeated many times along the channel, so as to multiply the electrons, whereby a lot of electrons are emitted from the output face of the MCP. The two-dimensional position of the electrons is maintained by these channels.

The MCPs 23-27 constitute first and second MCP stacks 30 and 32. The first stack 30 is a 2-plate stack consisting of two stacked MCPs 23 and 24. The first stack 30 directly faces the photocathode 22 with no other MCP being interposed between the photocathode 22 and the first stack 30. The MCPs 23 and 24 have input faces 23a and 24a, respectively, located opposite and apart from the photocathode 22. The output face 23b of MCP 23 is laid on the input face 24a of MCP 24. The output face 24b of MCP 24 is located opposite and apart from the input face 25a of MCP 25. The second stack 32 is a 3-plate stack consisting of three stacked MCPs 25-27. The output face 25c of MCP 25 is laid on the input face 26a of MCP 26, and the output face 26b of MCP 26 on the input face 27a of MCP 27. The output face 27b of MCP 27 is located opposite and apart from the input face of the resistive anode 28.

The reason why the MCPs 23-27 are separated into the two stacks 30 and 32 is efficient multiplication of photoelectrons. If all the MCPs are stacked in close vicinity, the photoelectrons will concentrate in a small number of channels, so as to readily cause saturation of multiplication. In contrast, when the MCPs 23-27 are separated into two stacks 30 and 32, a group of electrons multiplied by the front stack 30 is emitted from the stack 30 and travels toward the rear stack 32 while diffusing. This diffusion causes the photoelectrons to be multiplied by a greater number of channels in the rear stack 32. Consequently, the above configuration is able to prevent the saturation of multiplication and to multiply the photoelectrons efficiently.

In case where MCPs are used as multiple stacks like the stacks 30 and 32, the MCPs are preferably arranged so that the axes of the channels have an appropriate bias angle relative to the vertical axis to the MCPs. By adopting this arrangement, it becomes feasible to reduce noise due to ion feedback occurring with increase of gain and to achieve a high gain.

Since photoelectrons can be multiplied at a very high multiplication factor by the first stack 30, the multiplication factor of the second stack 32 may be lower than that of the first stack 30. In the present embodiment the multiplication factor of the first stack 30 is about $10^6$, and the multiplication factor of the second stack 32 about $10^2$. These multiplication factors are not completely constant, but have some fluctuations. Therefore, the stacks 30 and 32 have different multiplication factors for each multiplication.

The resistive anode 28 is one of position-sensitive anodes. The resistive anode 28 is an electrical conductor plate provided with a uniform resistive layer on one surface. Electrodes 28a for signal readout are provided at four positions in the periphery of the resistive anode 28. These electrodes 28a are electrically connected to the position calculator 16 through the respective preamplifiers 40, as shown in FIG. 1. For simplicity of the drawing, the drawing depicts only two out of the four electrodes 28a. In the drawing, the positions of the electrodes 28a are depicted nearer the center of resistive anode 28 than their actual positions. When the secondary electrons enter the resistive anode 28, these reading electrodes 28a emit charge pulses. The two-dimensional position of the secondary electrons incident on the resistive anode 28 can be determined according to the amounts of charge of these charge pulses. In this manner, each electrode 28a of the resistive anode 28 generates a signal DP corresponding to the detection position of the photon 15 and feeds it to the position calculator 16.

The photocathode 22, first and second MCP stacks 30 and 32, and resistive anode 28 are connected to the voltage divider circuit 80. The circuit 80 applies a voltage between the cathode 22 and the anode 28, as well as divides and applies the voltage to the first and second MCP stacks 30 and 32. In addition, the circuit 80 receives and amplifies the signals DP according to the detected position of the photon 15 from the resistive anode 28, and feeds the amplified signals to the position calculator 16. Furthermore, the circuit 80 acts as a pulse reading circuit for acquiring a pulse signal indicating the detection timing of the photon 15.

As shown in FIG. 2, electrodes 33 and 34 of ring shape are attached to the periphery of the input face 23a of MCP 23 and to the periphery of the output face 24b of MCP 24, respectively, in the first stack 30, and these electrodes are connected to a high-voltage supply 42 by lead wires. Similarly, electrodes 35 and 37 of ring shape are attached to the periphery of the input face 25a of MCP 25 and to the periphery of the output face 27b of MCP 27, respectively, in the second stack 32, and these electrodes are connected to the high-voltage supply 42 by lead wires. The high-voltage supply 42 is also connected to the photocathode 22 and to the resistive anode 28.

The high-voltage supply 42 applies the voltage to the photocathode 22, first stack 30, second stack 32, and resistive anode 28 to establish a potential gradient among these. This potential gradient provides the resistive anode 28, second stack 32, first stack 30, and photocathode 22 with potentials decreasing in the order named. A potential gradient is also formed in each MCP stack. In the first stack 30, the closer to the output face 24b of MCP 24, the higher the potential is given. In the second stack 32, the closer to the output face 27b of MCP 27, the higher the potential is given.

More specifically, resistors 81-85 are connected in series between the photocathode 22 and the high-voltage supply 42. The photocathode 22 and the electrode 33 are connected to the both ends of the resistor 81, whereby a potential gradient is formed between them. The electrodes 33 and 34 are connected to the both ends of the resistor 82, whereby a potential gradient is formed between the input face 23a and the output face 24b of the first MCP stack 30. The electrodes 34 and 35 are connected to the both ends of the resistor 83, whereby a potential gradient is formed between the first MCP stack 30 and the second MCP stack 32. The electrodes 35 and 37 are connected to the both ends of the resistor 84, whereby a potential gradient is formed between the input face 25a and the output face 27b of the second MCP stack 32. The electrode 37 and the resistive anode 28 are connected to the both ends of the resistor 85, whereby a potential gradient is formed between the second MCP stack 32 and the resistive anode 28.

As will be detailed later, on the output face 24b of MCP 24, a pulse signal DT is generated in synchronization with the detection timing of the photon. This pulse signal DT will be referred to hereinafter as a "detection timing pulse." As shown in FIG. 2, the electrode 34 provided on the output face 24b of MCP 24 is connected to a time-to-amplitude converter 17 through the voltage divider circuit 80. The detection timing pulse DT is fed to the time-to-amplitude converter 17 via the electrode 34 and the circuit 80.

In order to acquire the detection timing pulse DT, the circuit 80 has a resistor 86 and a high-voltage blocking capacitor 87 connected in series to each other. The electrode 34 is connected between the resistor 86 and the capacitor 87. The capacitor 87 separates a preamplifier 41, amplifiers 43 and 44, CFD 45, and TAC 17, which are described below, from the high-voltage supply 42 to protect the CFD 45 and TAC 17 from the high voltage generated by the high-voltage supply 42.

The position calculator 16 is electrically connected to the resistive anode 28 of the photomultiplier tube 14. The position calculator 16 calculates the position at which the photon 15 is detected, using the position signals DP fed from the resistive anode 28. An output terminal of the position calculator 16 is connected to a latch circuit 49. The detection position thus calculated is fed as a digital data to the latch circuit.

The time-to-amplitude converter (TAC) 17 is a time difference measurement device for measuring a time difference between two input signals. The TAC 17 is electrically connected to both the signal generator 12a in the tester 12 and the photomultiplier tube 14. The start terminal of TAC 17 is connected to the electrode 34 on MCP 24 through preamplifier 41, amplifiers 43 and 44, and constant fraction discriminator (CFD) 45. The TAC 17 receives the detection timing pulse DT from the photomultiplier tube 14 at its start terminal. On the other hand, the stop terminal of TAC 17 is connected to the tester 12 through amplifier 46 and delay circuit 47. The TAC 17 receives a reference time pulse RT from the signal generator 12a in tester 12, at its stop terminal. The TAC 17 generates an analog voltage signal having an amplitude corresponding to the time difference between the reference time pulse RT and the detection timing pulse DT. This time difference indicates the time at which the photon 15 is detected with respect to the reference time pulse. The output terminal of TAC 17 is connected to the latch circuit 49 through an A/D converter 48. The analog signal indicating the detection time is fed to the A/D converter 48 and is converted there into a digital data. This data indicating the detection time is fed to the latch circuit 49.

The latch circuit 49 receives the detection position data from the position calculator 16 and the detection time data from the TAC 17, and transfers them as a set of data to the data processor 18. The data processor 18 receives and stores the data from the latch circuit 49. The processor 18 is, for example, a personal computer. The processor 18 has a CPU, storage device, hard disk, keyboard, mouse, and display. The storage device stores a program and data necessary for data processing. The detection position and detection time fed from the latch circuit 49 are stored in association with each other in this storage device.

In the present embodiment, the data processor 18 also acts as a control unit in the time-resolved measurement apparatus 100. The position calculator 16 receives the position signals DP from the resistive anode 28 via the preamplifiers 40, calculates the detection position of the photon 15, converts it into a digital data, and feeds the digital data to the latch circuit 49. In addition, the processor 18 feeds a high-voltage control signal to the position calculator 16. The position calculator 16 is connected to the high-voltage supply 42, and causes the high-voltage supply 42 to generate an output voltage in response to the high-voltage control signal, or to stop the generation. The processor 18 feeds a time constant control signal to the TAC 17. The TAC 17 determines the time constant of the time-to-amplitude conversion in response to this signal. The processor 18 feeds a delay control signal to the delay circuit 47. The delay circuit 47 determines the delay in response to this signal.

The operation of the time-resolved measurement apparatus 100 will now be described. When the tester 12 activates the IC on the sample 10, a photon 15 is generated at a probability. The photomultiplier tube 14 receives the photon 15 at the photocathode 22. The photocathode 22 converts the photon 15 into a photoelectron by photoelectric effect. The photoelectron enters the input face 23a of MCP 23 due to the potential gradient between the photocathode 22 and the first stack 30. The MCPs 23 and 24 in the stack 30 multiply the photoelectron approximately $10^6$ times. The electrons thus multiplied travel to the output face 24b of MCP 24 due to the potential gradient in the stack 30. Thereafter, the electrons are emitted from the output face 24b of MCP 24 due to the potential gradient between the first and second stacks 30 and 32, and are then incident on the input face 25a of MCP 25. The MCPs 25-27 in the stack 32 multiply the electrons approximately $10^2$ times. The electrons travel to the output face 27b of MCP 27 due to the potential gradient in the stack 32. Thereafter, the electrons are emitted from the output face 27b of MCP 27 due to the potential gradient between the second stack 32 and the resistive anode 28, and collected to the resistive anode 28.

The resistive anode 28 feeds the charge pulses DP corresponding to the two-dimensional position of the electrons, from the four electrodes 28a to the position calculator 16. The position calculator 16 receives these charge pulses DP and calculates the two-dimensional position of the electrons by detection of the weighted center. This two-dimensional position is the detection position of the photon 15 and corresponds to the position of the light emission on the sample 10. The calculated detection position is fed to the data processor 18.

Furthermore, the photomultiplier tube 14 generates a pulse in synchronization with the detection timing of the photon 15. This detection timing pulse DT is taken out of the MCP 24 by the voltage divider circuit 80. When the electrons are emitted from the output face 24b of MCP 24 toward MCP 25, the potential instantaneously increases on the output face 24b of MCP 24. Subsequently, electrons flow from the high-voltage supply 42 into the MCP 24 to return the potential of the output face 24b to a predetermined steady potential. This flow of electrons is called a charge current. The charge current flows from the high-voltage supply 42 to the electrode 34 of MCP. 24 through the resistors 83-85. The resistor 86 is placed between the electrode 34 and the resistor 83. As a result, the impedance increases, thereby reducing the amount of the electrons flowing into the electrode 34 from the high-voltage supply 42 per unit time. In the high-frequency region, the impedance is lower in the path including the capacitor 87 than in the path including the resistors 83-86. Therefore, the electrons instantaneously flow from one end of the capacitor 87 into the electrode 34. Since the other end of the capacitor 87 is connected to the CFD 45 through the amplifiers, the flow of electrons to the electrode 34 results in a flow of a current pulse into the CFD 45. This current pulse is the detection timing pulse DT. In this manner, the circuit 80 is able to extract the detection timing pulse DT in synchronization with the instantaneous rise in the potential of the output face 24b of MCP 24. This detection timing pulse DT is fed to the TAC 17 through the CFD 45.

The TAC 17 receives from the tester 12 the reference time pulse RT synchronized with the activation of the IC on the sample 10, and receives from the CFD 45 the detection timing pulse DT. The TAC 17 measures the time difference between the reference time pulse RT and the detection timing pulse DT. As described above, this time difference indicates the detection time of the photon 15 with respect to the reference time pulse RT. This detection time is fed to the data processor 18.

The data processor 18 receives the detection position and the detection time, and stores them in association with each other in the storage device. Since the probability at which the transistors on the sample 10 emit light upon their switching is very small, the sample 10 is repeatedly excited to store the detection positions and detection times in the data processor 18. The stored data can be utilized in various ways. For example, the data processor 18 can be arranged to count the number of light emissions at each detection position over a specific period of time and generate a two-dimensional image in which luminances corresponding to the counted numbers are assigned to pixels corresponding to the detection positions. Furthermore, the data processor 18 can be arranged to create a histogram of the detection times at a specific detection position, using the stored detection times. In this histogram, the horizontal axis represents the detection times, and the vertical axis the number of light emissions. A peak in the histogram indicates a time at which light emissions at a specific detection position are detected at a high frequency. Therefore, the detection time corresponding to the peak can be regarded as a timing of the switching of the transistor corresponding to the detection position. By acquiring the switching timings of the transistors, it becomes feasible to analyze the operation of the IC on the sample 10.

The feature of the present embodiment is to read the detection timing pulse DT from MCP 24 located at the backmost position in the front stack 30. This will be described below in detail in comparison with the conventional technology.

For acquiring a detection timing pulse from the photomultiplier tube in the time-resolved measurement apparatus, it is necessary to determine where the detection timing pulse should be read. In case where the timing pulse is read from the anode, if the anode is of the position-sensitive type, the read speed of the timing pulse is low because of the resistance and capacitance on the signal reading path around the anode. Also, since the signal reading path is a high-impedance circuit, the timing pulse is likely to be affected by external noise. Therefore, it is difficult to achieve satisfactory time precision even with optimization of external circuitry. Furthermore, an additional circuit for acquisition of the timing pulse degrades the S/N of the signal. For this reason, the position resolution also degrades as well as the time precision.

In contrast, the conventional technology is to acquire the detection timing pulse from the output face of the MCP directly opposing to the anode. Namely, a potential rise pulse, which is generated when electrons from the output face of the backmost final MCP are emitted toward the anode, is read out as a detection timing pulse. The amount of potential rise is proportional to the amount of emitted charge, and the amount of charge is largest at the final MCP. Therefore, the detection timing pulse with high S/N can be read from the final MCP.

Figure 3:
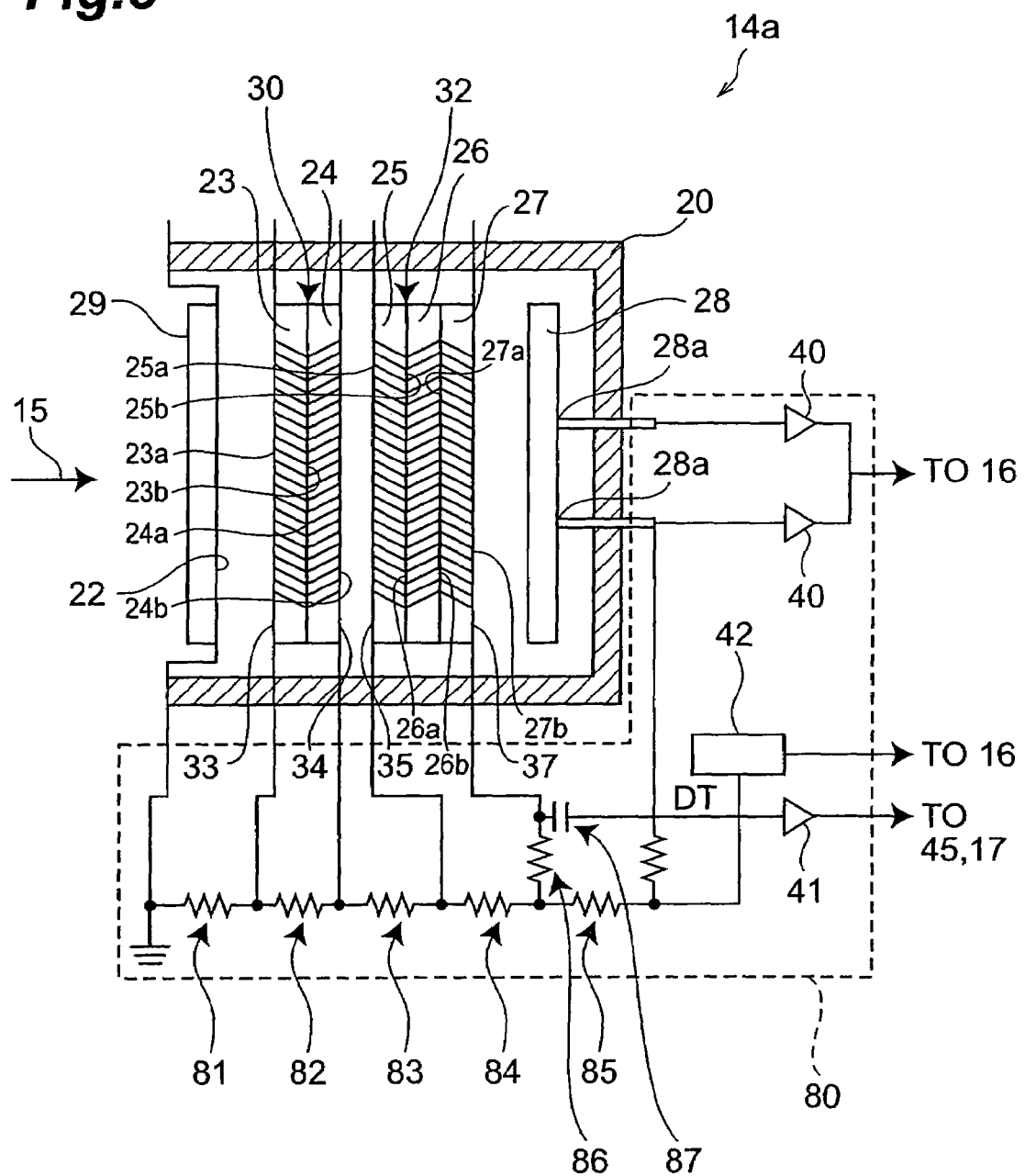
FIG. 3 is a schematic view showing the structure of a photomultiplier tube as a comparative example.
Figure 4:
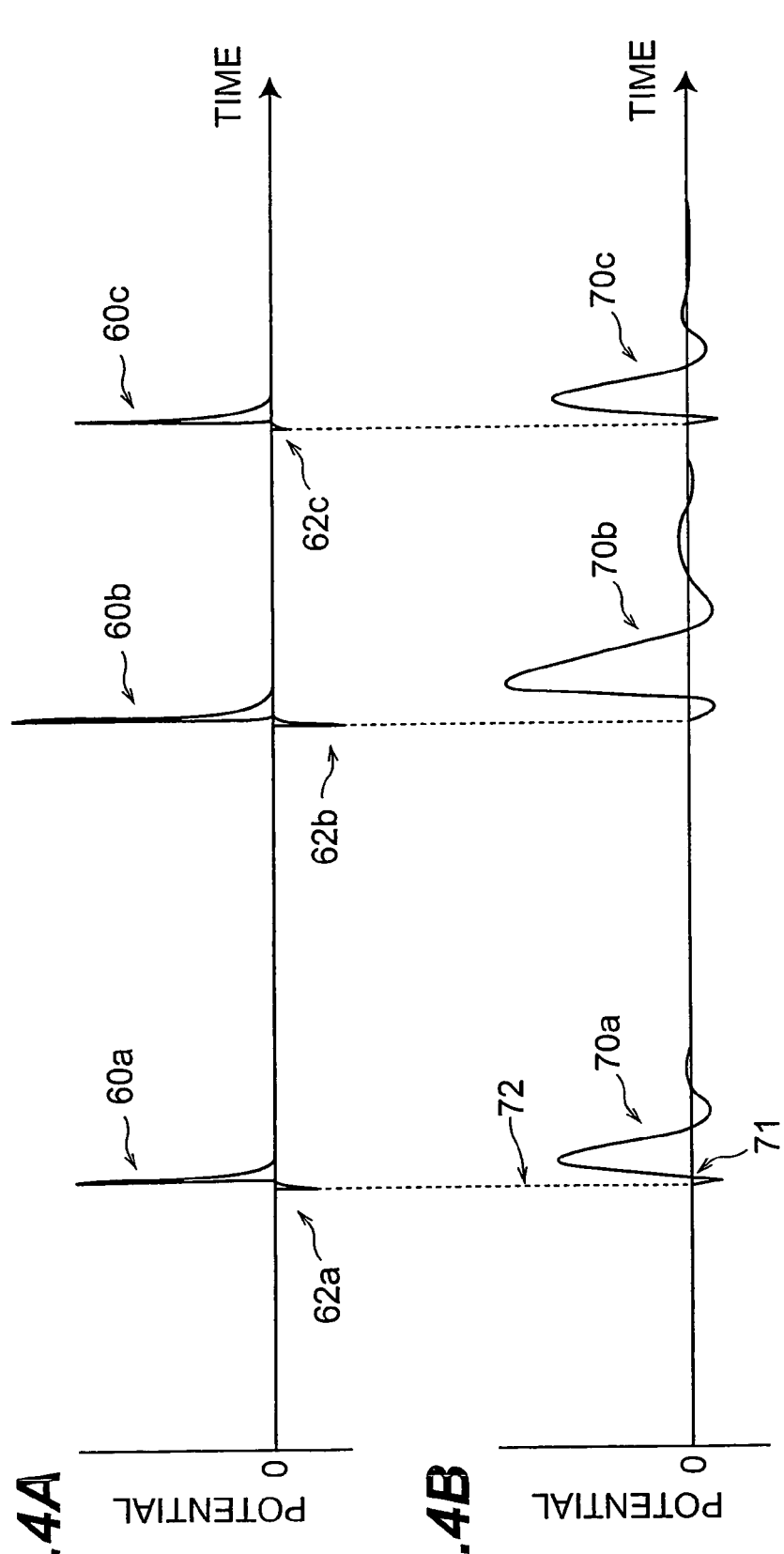
FIG. 4A depicts a temporal change of potential at an electrode of a backmost MCP in a second stack, and FIG. 4B a detection timing pulse taken out of the electrode.

However, the inventors realized that the reading of the detection timing pulse from the final MCP had a disadvantage, contrary to the above advantage. This disadvantage will be described below with reference to FIGS. 3 and 4. FIG. 3 is a schematic view showing the structure of a photomultiplier tube 14a in which the detection timing pulse DT is read from the electrode 37 on the final MCP 27. The electrode 37 is connected to the TAC 17 via amplifiers and a constant fraction discriminator, as the electrode 37 in the present embodiment is. FIG. 4A depicts a temporal change of the potential on the electrode 37, and FIG. 4B the timing pulses DT taken out of the electrode 37.

When electrons multiplied by MCPs 23-27 are emitted from the output face 27b of MCP 27, a potential rise pulse 60 appears on the electrode 37, as shown in FIG. 4A. The potential rise pulse 60 appears each time a photon is detected. If three photons are successively emitted from a sample, three potential rise pulses 60a-60c appear as shown in FIG. 4A. As described previously, the multiplication factors of the first and second MCP stacks 30 and 32 have some fluctuations.

The potential rise pulses 60a-60c have various heights according to the multiplication fluctuations.

The inventors found that other pulses 62a-62c appear immediately before the potential rise pulses 60a-60c on the electrode 37. These pulses 62 result from the fact that the photomultiplier tube 14 has the two MCP stacks 30 and 32 spaced from each other. Electrons multiplied by the first stack 30 are emitted from the output face of MCP 24 and are then incident on the input face of the second stack 32, i.e., on the input face 25a of MCP 25 located at the foremost position in the second stack 32. At this time, a pulse 62 is generated on the electrode 37 due to the capacitive coupling between the electrode 35 on the input face 25a and the electrode 37 on the output face 27b in the second stack 32. This pulse 62 will be referred to hereinafter as an "electron input pulse." The height of the electron input pulse 62 depends on the multiplication factor of the first stack 30. The electron input pulses 62a-62c have various heights according to the multiplication fluctuations of the first stack 30.

The potential rise pulse 60 has the positive polarity and the electron input pulse 62 the negative polarity. The electron input pulse 62 is generated in response to the incidence of electrons from the first stack 30 to the second stack 32, and the potential rise pulse 60 is generated after the multiplication of the electrons by the second stack 32. For this reason, the potential rise pulse 60 appears on the electrode 37, with a delay of about 300 psec after the electron input pulse 62. The pulses 60 and 62 overlap in part with each other and are read as one pulse 70, as shown in FIG. 4B, from the electrode 37. This pulse 70 is the detection timing pulse DT mentioned above.

Since the second stack 32 has the multiplication factor of about $10^2$, the potential rise pulse 60 has a height approximately 10-100 times that of the electron input pulse 62. However, the height of the potential rise pulse 60 is affected by the multiplication fluctuations of both the stacks 30 and 32, whereas the height of the electron input pulse 62 is affected by only the multiplication fluctuations of the stack 30. For this reason, the heights of these pulses 60 and 62 have fluctuations that do not correlate with each other. Therefore, the positive potential rise pulse 60 and the negative electron input pulse 62 are combined at a different ratio between their heights each time a photon is detected, to form a detection timing pulse.

Figure 5:
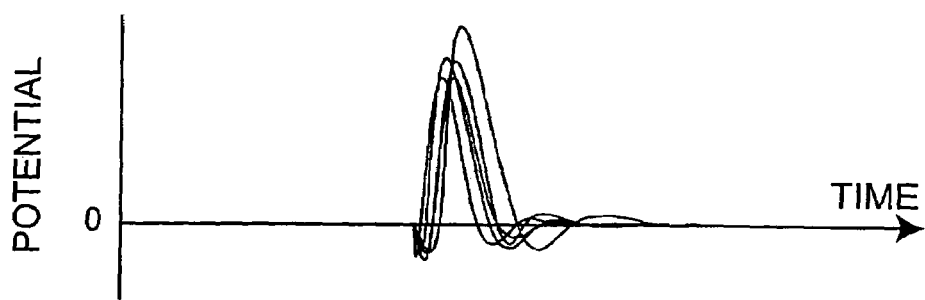
FIG. 5 depicts superposition of detection timing pulses acquired by multiple detections.

The CFD 45 determines timing 71 at which the pulse 70 crosses the ground level. This is called zero-cross timing. The TAC 17 treats this zero-cross timing as a reception timing of the pulse 70. Since the pulse 70 has a negative component corresponding to the electron input pulse 62, the zero-cross timing 71 has a delay relative to timing 72 at which the photoelectrons are incident on the second stack 32. Since the heights of the potential rise pulse 60 and the electron input pulse 62 have a different ratio therebetween each time a photon is detected, the delay time of the zero-cross timing 71 from the electron input timing 72 is not constant. This will become more apparent with reference to FIG. 5 showing superposition of detection timing pulses in plural times of photon detection. This nonuniformity of the delay of zero-cross timing 71 will cause fluctuations (jitters) of the detection time not less than 200 psec, so as to degrade the time precision.

Figure 6A:
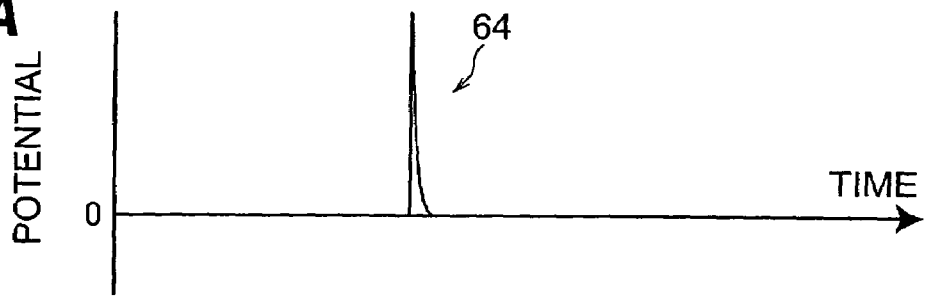
FIG. 6A depicts a temporal change of potential at an electrode of a backmost MCP in a first stack, and FIG. 6B superposition of detection timing pulses acquired by multiple detections.
Figure 6B:
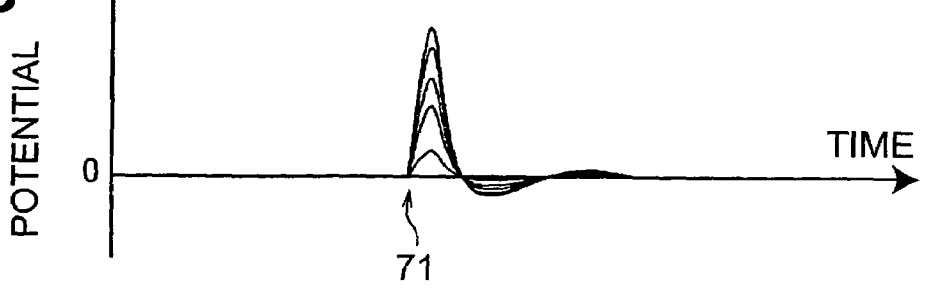

In contrast, the time-resolved measurement apparatus 100 of the present embodiment is arranged to read the detection timing pulse from the backmost MCP 24 in the first stack 30. It is a photoelectron converted from one photon that enters the first stack 30, and the photoelectron has not been multiplied at all. For this reason, the electron input pulse generated in the electrode 34 of MCP 24 is very small. As shown in FIG. 6A, only a potential rise pulse 64 appears on the electrode 34 of MCP 24, virtually. Therefore, the fluctuations of the zero-cross timing can be suppressed as apparent with reference to FIG. 6B showing superposition of detection timing pulses in plural times of photon detection. The photoelectron is multiplied $10^6$ times by the first stack 30 and then emitted from the MCP 24. Although the amount of charge of these photoelectrons is approximately $\frac{1}{100}$ times the amount of charge emitted from the final MCP 27, the photoelectrons can generate the potential rise pulse 64 having a sufficient height. Therefore, the present embodiment efficiently prevents the degradation of S/N and time precision of the detection timing pulse. As a result, it is feasible to achieve good time precision of about 60 psec.

The number of output terminals to be electrically connected to the electrode 34 in order to acquire the detection timing pulse does not have to be limited to 1, but a plurality of output terminals may be provided. These output terminals preferably have the same length.

SECOND EMBODIMENT

Figure 7:
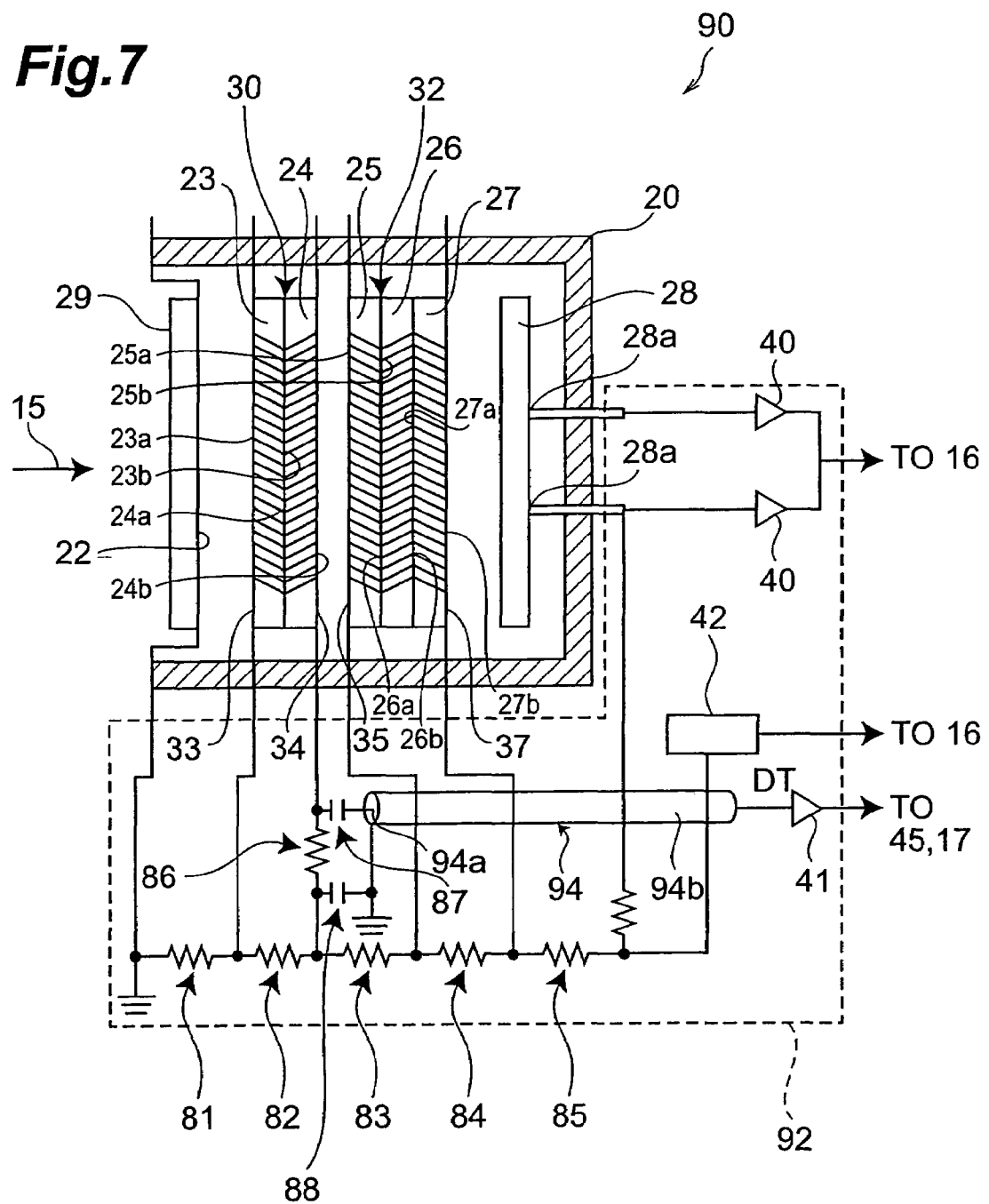
FIG. 7 is a schematic view showing the structure of a photomultiplier tube according to the second embodiment.

A time-resolved measurement apparatus of the present embodiment has a configuration in which a photomultiplier tube 90 is installed instead of the photomultiplier tube 14 in the apparatus 100 of the first embodiment. FIG. 7 is a schematic view showing the structure of the position-sensitive photomultiplier tube 90 used in the present embodiment. The photomultiplier tube 90 has a voltage divider circuit 92 different from that in the photomultiplier tube 14 of the first embodiment.

The circuit 92 differs from the voltage divider circuit 80 in the first embodiment in the configuration for acquisition of the detection timing pulse DT from MCP 24. More specifically, the circuit 92 has a high-voltage blocking capacitor 88 and a coaxial cable 94, in addition to the resistor 86 and the capacitor 87 connected to the electrode 34 of MCP 24. The coaxial cable 94 has an internal conductor (i.e., a core line) 94a, and an external conductor 94b of cylindrical shape coaxially surrounding the internal conductor 94a. One end of the internal conductor 94a is connected to one end of the resistor 86 the through capacitor 87, and the other end is connected to the CFD 45 and TAC 17 through the preamplifier 41 and the amplifiers 43 and 44. The external conductor 94b is connected to the other end of the resistor 86 through the capacitor 88, and is grounded.

As described previously, when electrons are emitted from the output face 24b of MCP 24 toward MCP 25, the potential instantaneously increases on the output face 24b of MCP 24. In response to this potential rise, a charge current is supplied from high-voltage supply 42 to MCP 24. However, the path between high-voltage supply 42 and MCP 24 has the impedance increased by the resistor 86. For this reason, in the high-frequency region, the impedance is lower in the path including the capacitors 87 and 88 and the coaxial cable 94 than in the path including the resistor 86. Therefore, the electrons instantaneously flow from the path including the coaxial cable 94 into the electrode 34. The CFD 45 is connected to the end of the coaxial cable 94 opposite to the end connected to the capacitor 87. For this reason, the flow of electrons to the electrode 34 results in a flow of a current pulse into the CFD 45. This current pulse is the detection timing pulse DT. In this manner, the circuit 92 is able to extract the detection timing pulse DT in synchronization with the instantaneous rise of the potential on the output face 24b of MCP 24.

The present embodiment has the same advantage as the first embodiment. Furthermore, since the detection timing pulse DT is transmitted through the coaxial cable 94, the pulse DT suffers less deterioration of its waveform. Therefore, the time precision of the time-resolved measurement can be further enhanced.

THIRD EMBODIMENT

Figure 8:
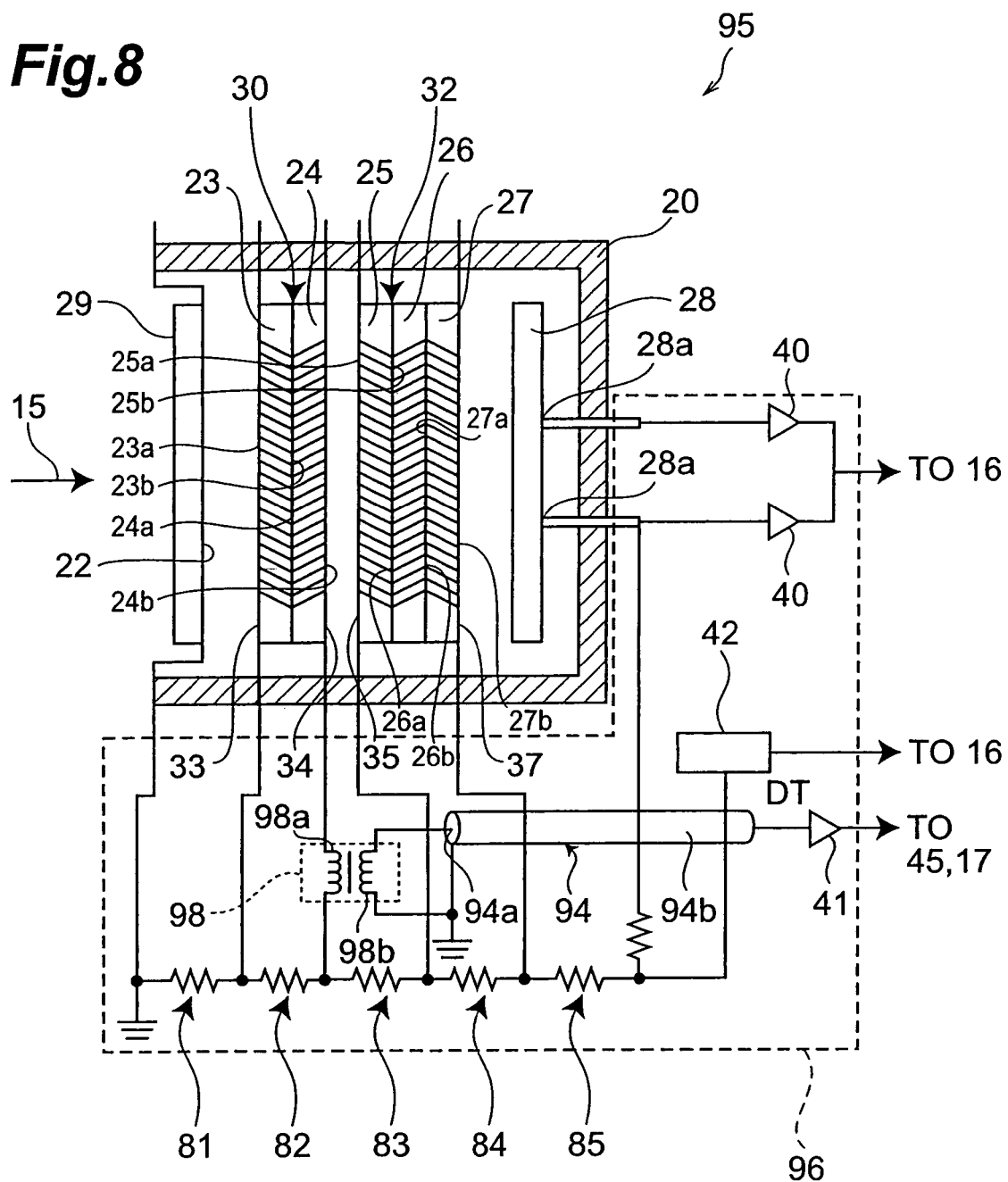
FIG. 8 is a schematic view showing the structure of a photomultiplier tube according to the third embodiment.

A time-resolved measurement apparatus of the present embodiment also has a configuration in which a photomultiplier tube 95 is installed instead of the photomultiplier tube 14 in the apparatus 100 of the first embodiment. FIG. 8 is a schematic view showing the structure of the position-sensitive photomultiplier tube 95 used in the present embodiment. The photomultiplier tube 95 has a voltage divider circuit 96 different from that in the photomultiplier tube 14 of the first embodiment.

The circuit 96 differs from the voltage divider circuits 80 and 92 of the first and second embodiments in the configuration for acquisition of the detection timing pulse DT from the MCP 24. More specifically, the circuit 96 has a high-frequency transformer 98 instead of the resistor 86 and the capacitors 87 and 88 in the voltage divider circuit 92. The transformer 98 is connected between the electrode 34 of MCP 24 and the coaxial cable 94. The transformer 98 separates CFD 45 and TAC 17 from high-voltage supply 42, thereby protecting CFD 45 and TAC 17 from the high voltage generated by the high-voltage supply 42. The electrode 34 is connected to the primary side of the transformer, and the coaxial cable 94 to the secondary side of the transformer. More specifically, one end of primary coil 98*a* is connected to the electrode 34, and the other end is connected between the resistors 82 and 83. One end of secondary coil 98*b* is connected to internal conductor 94*a* of coaxial cable 94, and the other end is grounded together with external conductor 94*b*.

When electrons are emitted from the output face 24*b* of MCP 24 toward MCP 25, the potential instantaneously increases on the output face 24*b* of MCP 24. In response to this potential rise, a charge current is instantaneously supplied from the high-voltage supply 42 to MCP 24. The primary side of the high-frequency transformer 98 is connected to the path of the charge current. For this reason, an electromotive force corresponding to the AC component of the charge current is produced on the secondary side of the transformer 98. This electromotive force generates a pulse current, which is transmitted through the coaxial cable 94 connected to the secondary side of the transformer 98. This current pulse is the detection timing pulse DT. The CFD 45 is connected to the end of the coaxial cable 94 opposite to the end connected to the transformer 98. For this reason, the detection timing pulse DT flows into the CFD 45. In this manner, the circuit 96 is able to extract the detection timing pulse DT in synchronization with the instantaneous rise of the potential on the output face 24*b* of MCP 24.

The present embodiment has the same advantage as the first embodiment. Furthermore, since the detection timing pulse DT is transmitted through the coaxial cable 94, the pulse DT suffers less deterioration of its waveform. Therefore, the time precision of the time-resolved measurement can be further enhanced.

The present invention has been described above in detail on the basis of the embodiments thereof. It is, however, noted that the present invention is by no means intended to be limited to the above embodiments. The present invention can be modified in various ways without departing from the spirit and scope of the invention.

In this specification, a "photomultiplier tube (PMT)" is one of the embodiments of an "electron multiplier tube (EMT)."

The embodiments mentioned above use the position-sensitive photomultiplier tubes (PS-PMTs). However, for the present invention, it is possible to use any other position-sensitive electron multiplier tubes (PS-EMTs) depending on the type of the quantum beam emitted from the sample. It is well known that micro channel plates are not sensitive only to electron beams but are also sensitive directly to other quantum beams, such as ultraviolet rays (UV and VUV), X-rays, α-rays, charged particles, and neutrons. When such quantum beams are incident on the channels of the micro channel plates, electrons are emitted and multiplied in the channels. Which of a PS-PMT and a PS-EMT is to be used is properly determined depending on the type of a quantum beam emitted from an object to be detected.

The embodiments mentioned above use the resistive anode 28 as a position-sensitive anode. Alternatively, it is also possible to use any other position-sensitive anodes, e.g., multi-anodes, a CR chain type anode, a cross-wire anode, and a semiconductor position sensitive detector (PSD). The position of photoelectrons may also be measured by using a fluorescent screen, as an anode, for converting the photoelectrons into an optical image and taking the optical image by use of an image sensor. The fluorescent screen may be fiber-coupled with the image sensor through a fiber plate. These position detections may be one-dimensional or two-dimensional.

The embodiments mentioned above take up the analysis of the operation of the semiconductor integrated circuit. However, the time-resolved detection according to the present invention can be applied to a wide variety of applications, and the present invention can be applied to various measurement techniques including Time of Flight (TOF) application, e.g., secondary ion mass spectroscopy (SIMS), ion scattering spectroscopy (ISS), an atom probe, and so on.

In the second and third embodiments, the detection timing pulse DT is transmitted using the coaxial cable 94. However, if the transmission distance of the detection timing pulse DT is short, two parallel signal lines corresponding to the core line and external conductor of the coaxial cable 94 can be used in place of the coaxial cable 94.

INDUSTRIAL APPLICABILITY

The time-resolved measurement apparatus of the present embodiment is arranged to read a detection timing pulse not from the backmost micro channel plate directly opposing to the anode, but from a micro channel plate at the anterior position. Thus it is possible to reduce the negative component in the detection timing pulse, thereby enhancing the time precision of the time-resolved measurement.

The invention claimed is:

1. A time-resolved measurement apparatus for acquiring position information and timing information of a quantum beam generated due to excitation of a sample, comprising:
   a signal generator for generating a reference time pulse in synchronization with the excitation of the sample;
   a detector for detecting the quantum beam and for generating a position signal corresponding to a detection position and a detection timing pulse synchronized with detection timing;
   a position calculator for calculating the detection position using the position signal;
   a time difference measuring device for measuring a time difference between the reference time pulse and the detection timing pulse; and
   a data processor for storing the detection position calculated by the position calculator and the time difference measured by the time difference measuring device, in association with each other, the detector having a position-sensitive electron multiplier tube, the electron multiplier tube having an entrance window that transmits the quantum beam, first and second micro channel plates for generating an electron at a position corresponding to an incidence position of the quantum beam on the entrance window and for multiplying the electron while maintaining the position, and an anode, the first micro channel plate having an input face located opposite and apart from the entrance window, and an output face located opposite and apart from the second micro channel plate, the second micro channel plate having an input face located opposite and apart from the output face of the first micro channel plate, and an output face located opposite and apart from the anode, the detection timing pulse being generated in response to a potential change that occurs when electrons multiplied by the first micro channel plate are emitted from the first micro channel plate, and being fed to the time difference measuring device, and a pulse reading circuit for acquiring a pulse signal in response to the potential change that occurs when electrons multiplied by the first micro channel plate are emitted from the first micro channel plate, the pulse reading circuit being only connected to the output face of the first micro channel plate.

2. The time-resolved measurement apparatus according to claim 1, further comprising:

a first stack having the first micro channel plate, and at least one micro channel plate disposed on the input face of the first micro channel plate; and a second stack having the second micro channel plate, and at least one micro channel plate disposed on the input face of the second micro channel plate and located opposite and apart from the first micro channel plate.

3. The time-resolved measurement apparatus according to claim 2, wherein the first stack is located opposite the entrance window with no other micro channel plate being interposed between the entrance window and the first stack.

4. The time-resolved measurement apparatus according to claim 2, wherein the first stack has an electron multiplication factor higher than that of the second stack.

5. The time-resolved measurement apparatus according to claim 1, wherein the position-sensitive electron multiplier tube is a position-sensitive photomultiplier tube further comprising a photocathode for converting the quantum beam into a photoelectron by photoelectric effect, the photocathode being disposed between the entrance window and the input face of the first micro channel plate, and wherein the first micro channel plate is located opposite the photocathode and receives the photoelectron from the photocathode to generate and multiply secondary electrons.

6. The time-resolved measurement apparatus according to claim 1, wherein the pulse reading circuit comprises a capacitor or a transformer connected to the output face of the first micro channel plate.

7. A position-sensitive electron multiplier tube comprising:

an entrance window that transmits a quantum beam;

first and second micro channel plates for generating an electron at a position according to an incidence position of the quantum beam on the entrance window and for multiplying the electron while maintaining the position;

an anode located opposite the second micro channel plate; and a pulse reading circuit for acquiring a pulse signal in response to a potential change that occurs when electrons multiplied by the first micro channel plate are emitted from the first micro channel plate, the first micro channel plate having an input face located opposite and apart from the entrance window, and an output face located opposite and apart from the second micro channel plate, the second micro channel plate having an input face located opposite and apart from the output face of the first micro channel plate, and an output face located opposite and apart from the anode, and the pulse reading circuit being only connected to the output face of the first micro channel plate.

8. The position-sensitive electron multiplier tube according to claim 7, further comprising:

a first stack having the first micro channel plate, and at least one micro channel plate disposed on the input face of the first micro channel plate; and a second stack having the second micro channel plate, and at least one micro channel plate disposed on the input face of the second micro channel plate and located opposite and apart from the first micro channel plate.

9. The position-sensitive electron multiplier tube according to claim 8, wherein the first stack is located opposite the entrance window with no other micro channel plate being interposed between the entrance window and the first stack.

10. The position-sensitive electron multiplier tube according to claim 8, wherein the first stack has an electron multiplication factor higher than that of the second stack.

11. The position-sensitive electron multiplier tube according to claim 7, further comprising a photocathode for converting the quantum beam into a photoelectron by photoelectric effect, the photocathode being disposed between the entrance window and the first micro channel plate, and wherein the first micro channel plate is located opposite the photocathode and receives the photoelectron from the photocathode to generate and multiply secondary electrons.

12. The position-sensitive electron multiplier tube according to claim 7, wherein the pulse reading circuit comprises a capacitor or a transformer connected to the output face of the first micro channel plate.

* * * * *